US012592713B2

(12) United States Patent
Sen et al.

(10) Patent No.: US 12,592,713 B2
(45) Date of Patent: Mar. 31, 2026

(54) SYSTEM AND METHOD FOR CONVERTING DIRECT ANALOG SAMPLES TO COMPRESSED DIGITIZED SAMPLES

(71) Applicant: Quasistatics Inc., West Lafayette, IN (US)

(72) Inventors: Shreyas Sen, West Lafayette, IN (US); Gaurav Kumar K, West Lafayette, IN (US)

(73) Assignee: Quasistatics Inc., West Lafayette, IN (US)

( * ) Notice: Subject to any disclaimer, the term of this patent is extended or adjusted under 35 U.S.C. 154(b) by 128 days.

(21) Appl. No.: 18/402,813

(22) Filed: Jan. 3, 2024

(65) Prior Publication Data

US 2025/0219653 A1     Jul. 3, 2025

(51) Int. Cl.
*H03M 1/44*       (2006.01)
*H03M 1/12*       (2006.01)
*H03M 1/34*       (2006.01)

(52) U.S. Cl.
CPC ............. *H03M 1/442* (2013.01); *H03M 1/12* (2013.01); *H03M 1/34* (2013.01)

(58) Field of Classification Search
CPC .... H04N 19/12; H04N 19/122; H04N 19/117; H04N 19/625; H03M 1/34; H03M 1/12; H03M 1/442; H03M 1/36
See application file for complete search history.

(56) References Cited

U.S. PATENT DOCUMENTS

| | | | |
|---|---|---|---|
| 6,141,455 A | * | 10/2000 | Matsuzawa .......... H04N 19/126 |
| | | | 382/250 |
| 6,473,527 B1 | | 10/2002 | Wang |
| 2011/0261878 A1 | | 10/2011 | Lu et al. |
| 2020/0145680 A1 | | 5/2020 | Dikshit et al. |

* cited by examiner

*Primary Examiner* — Benyam Haile

(74) *Attorney, Agent, or Firm* — Kevin J Fournier Intellectual Property Legal Services Ltd.; Kevin J Fournier

(57)       ABSTRACT

A system and method for converting direct analog samples to compressed digitized samples is disclosed. The system includes a switch capacitor based analog processing unit configured to receive input analog samples from an image processing system. Further, the switch capacitor based analog processing unit is configured to compress the received plurality of input analog samples in analog domain to generate compressed analog samples using a plurality of switch capacitor circuitry. The compressed analog samples include a plurality of significant analog samples and a plurality of insignificant analog samples. Further, the system includes an analog-to-digital converter (ADC) electrically connected to the switch capacitor based analog processing unit. The ADC is configured to convert the plurality of significant analog samples to a plurality of digitized significant bits. The ADC is activated for processing the plurality of significant analog samples and power gated for the plurality of insignificant analog samples.

18 Claims, 11 Drawing Sheets

200A

300

400

ANALOG
IMAGE
VOLTAGE

IMAGE
402

8X8
IMAGE
WINDOW
404

SYSTEM 206

2D DCT
CIRCUIT
406

Q UNIT
408

ADC
210

JPEG
ENCODED
IMAGE
BITS

ZIGZAG
TRAVERSING
UNIT 410

RUN
LENGTH
ENCODER
UNIT 412

600

700A

408

2D DCT
PROCESSOR

Q-BLOCK

QUANTIZATION
(Q) MATRIX

702

704

700B

900

RECEIVE A PLURALITY OF INPUT ANALOG SAMPLES FROM AN IMAGE PROCESSING SYSTEM 902

COMPRESS THE RECEIVED PLURALITY OF INPUT ANALOG SAMPLES IN AN ANALOG DOMAIN TO GENERATE COMPRESSED ANALOG SAMPLES USING A PLURALITY OF SWITCH CAPACITOR CIRCUITRY 904

CONVERT THE PLURALITY OF SIGNIFICANT ANALOG SAMPLES TO A PLURALITY OF DIGITIZED SIGNIFICANT BITS 906

SYSTEM AND METHOD FOR CONVERTING DIRECT ANALOG SAMPLES TO COMPRESSED DIGITIZED SAMPLES

TECHNICAL FIELD

Embodiments of the present disclosure generally relate to data compression systems, and more particularly relates to a system and method for converting direct analog samples to compressed digitized samples.

BACKGROUND

Traditional JPEG compression systems involve power-intensive analog-to-digital conversion process to transform analog image voltages to digital bits. Such JPEG compression systems primarily rely on digital processing, where analog-to-digital converters (ADCs) play a vital role in converting the analog image voltage to the digital bits for each pixel. This conventional approach, as illustrated in FIG. 1, is associated with significant power consumption and area-intensive operations due to complex network architecture 100. Such network architecture 100 may constitute registers and division blocks. Such network architecture 100 may employ imaging sensor nodes which often face challenges associated with power consumption, particularly in scenarios where stringent power levels are to be maintained.

Further, the ADC 114 may be consistently engaged in compression process, contributing to overall power requirements of the traditional JPEG compression systems 112. For example, FIG. 1 illustrates a block diagram of a conventional JPEG compression system 112. The network architecture 100 includes a camera setup 102 and a JPEG compression system 112. The camera setup 102 may include an object 104, an objective imaging lens 106, a digital micromirror device (DMD) 110 and a relay imaging lens 108. The camera setup 102 is configured to generate analog image voltages from the capture image of the object 104. The JPEG compression system 112 includes the ADC 114 and the digital JPEG compression block 116. The A major contributing factor to power consumption in traditional JPEG systems 112, such as those shown in FIG. 1, lies in the continuous operation of the ADC 114 while converting the analog image voltage to the digital bits within the digital domain. This energy-intensive process involves a plurality of constituting registers and division blocks, leading to substantial power requirements.

Conventional digital approaches, exemplified by some of the existing solutions exhibit substantial power requirements that are often incompatible with the restricted power budgets of the traditional JPEG compression systems 112 involving imaging sensor nodes.

As imaging technologies continue to advance, there is an increasing demand for low-power solutions to enable prolonged operation, particularly in remote or resource-constrained environments. Although the current state-of-the-art JPEG digital accelerators provide effective image compression, such accelerators fail to meet stringent power limitations imposed by the traditional JPEG compression systems 112 involving imaging sensor nodes.

Moreover, the transition towards analog processing, as observed in some of the existing solutions, underscores the need for alternative methodologies that utilize analog schemes to perform image compression tasks efficiently. The noise margins associated with analog processing, when compared to digital counterparts, provides an advantage in terms of power efficiency. However, existing analog solutions lack an end-to-end methodology for directly converting analog pixel data into JPEG-encoded information bits.

Therefore, there is a need in the art to provide a system and method for converting direct analog samples to compressed digitized samples by shifting entire processing, including arithmetic manipulations, to the analog domain and to significantly enhance overall energy efficiency of image compression processes to address the aforementioned deficiencies in the art.

SUMMARY

This summary is provided to introduce a selection of concepts, in a simple manner, which is further described in the detailed description of the disclosure. This summary is neither intended to identify key or essential inventive concepts of the subject matter nor to determine the scope of the disclosure.

An aspect of the present disclosure provides a system for converting direct analog samples to compressed digitized samples. The system includes a switch capacitor based analog processing unit configured to receive a plurality of input analog samples from an image processing system. The plurality of input analog samples include a plurality of analog media voltages. Further, the switch capacitor based analog processing unit is configured to compress the received plurality of input analog samples in analog domain to generate compressed analog samples using a plurality of switch capacitor circuitry. The compressed analog samples include a plurality of significant analog samples and a plurality of insignificant analog samples. Further, the system includes an analog-to-digital converter (ADC) electrically connected to the switch capacitor based analog processing unit. The ADC is configured to convert the plurality of significant analog samples to a plurality of digitized significant bits. The ADC is activated for processing the plurality of significant analog samples and power gated for the plurality of insignificant analog samples.

Another aspect of the present disclosure includes a method for converting direct analog samples to compressed digitized samples. The method includes receiving a plurality of input analog samples from an image processing system. The plurality of input analog samples comprises a plurality of analog media voltages. The method further includes compressing the received plurality of input analog samples in an analog domain to generate compressed analog samples using a plurality of switch capacitor circuitry. The compressed analog samples comprise a plurality of significant analog samples and a plurality of insignificant analog samples. The method further includes converting the plurality of significant analog samples to a plurality of digitized significant bits. The method further includes converting the plurality of significant analog samples by activating an analog to digital converter for processing the plurality of significant analog samples and power gating the ADC for the plurality of insignificant analog samples.

Yet another aspect of the present disclosure provides a non-transitory computer-readable medium comprising machine-readable instructions that are executable by a processor to receive a plurality of input analog samples from an image processing system. The plurality of input analog samples comprises a plurality of analog media voltages. The processor further is to compress the received plurality of input analog samples in analog domain to generate compressed analog samples using a plurality of switch capacitor circuitry. The compressed analog samples comprise a plurality of significant analog samples and a plurality of insignificant analog samples. Further, the processor is to convert the plurality of significant analog samples to a plurality of digitized significant bits. Converting the plurality of significant analog samples comprises activating an analog to digital converter for processing the plurality of significant analog samples and power gating the ADC for the plurality of insignificant analog samples.

To further clarify the advantages and features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF ACCOMPANYING DRAWINGS

The disclosure will be described and explained with additional specificity and detail with the accompanying figures in which.

Figure 8:
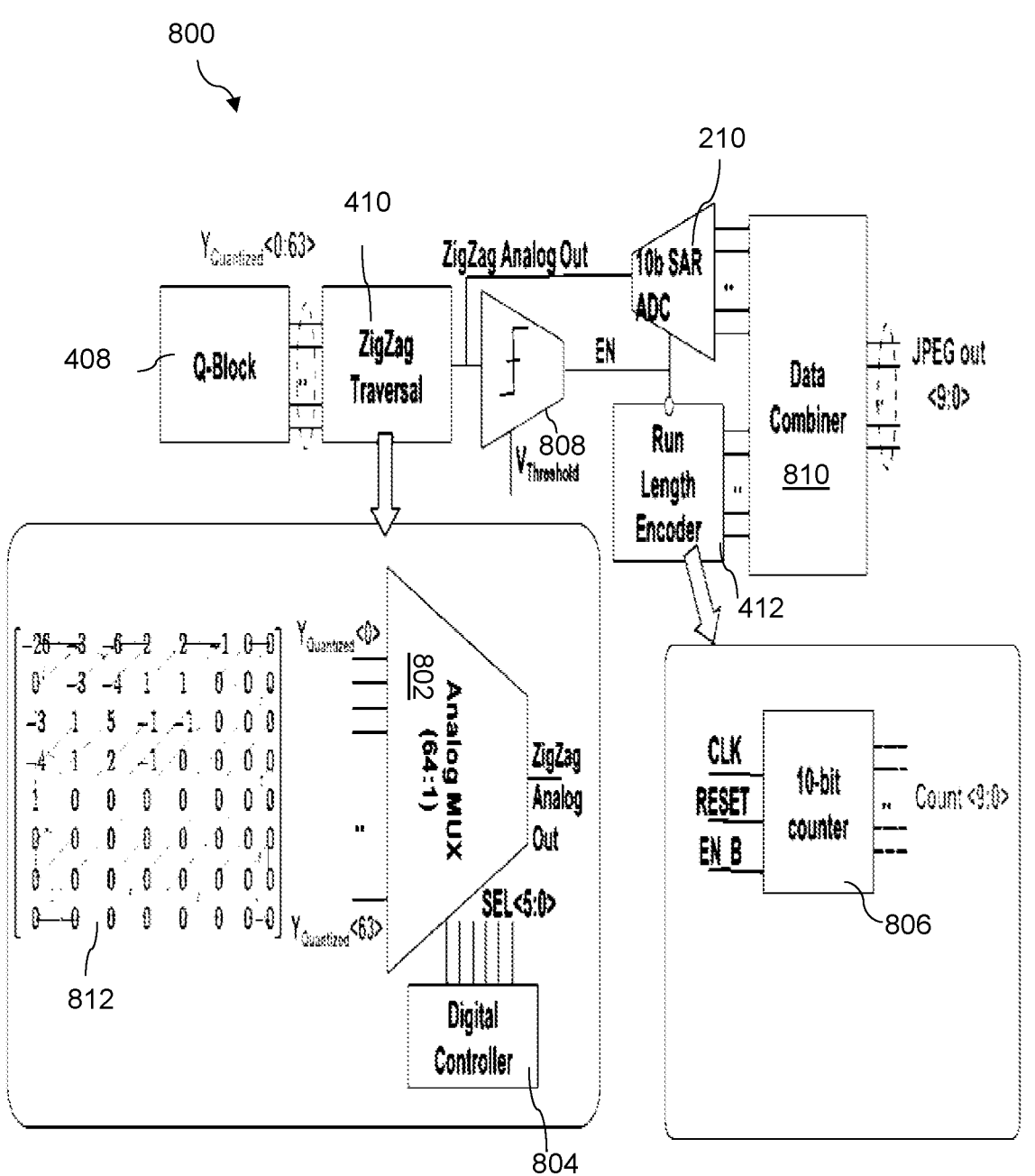
Figure 9:
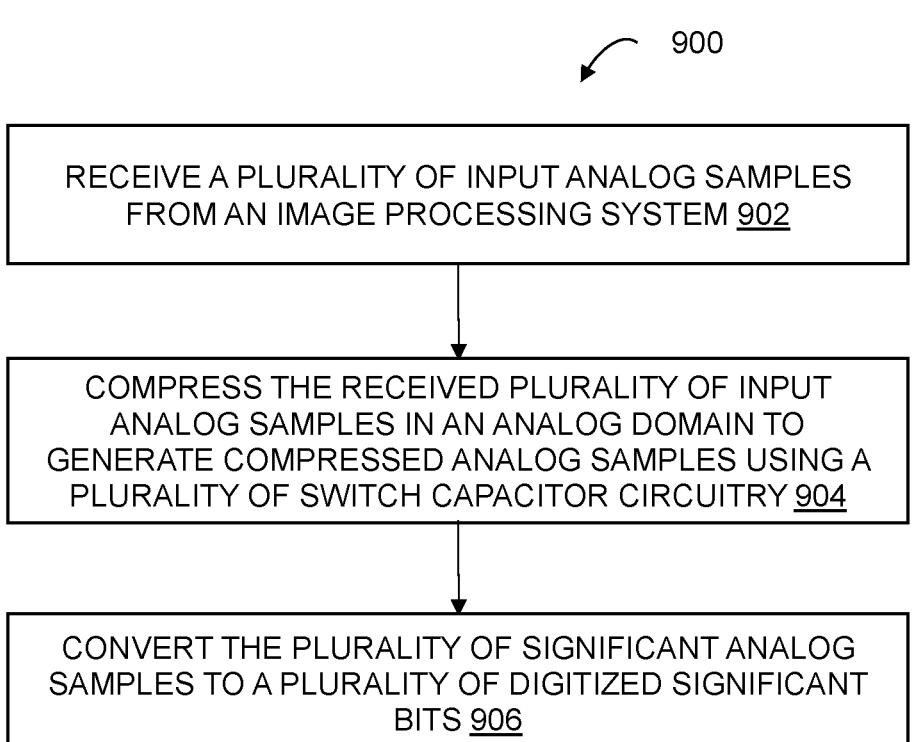

FIG. 8 illustrates an exemplary block diagram representation depicting a process converting direct analog samples to compressed digitized samples, according to an example embodiment of the present disclosure; and FIG. 9 illustrates an exemplary flow chart representation of a method for converting direct analog samples to compressed digitized samples, according to an example embodiment of the present disclosure.

Further, those skilled in the art will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the embodiments of the present disclosure so as not to obscure the figures with details that will be readily apparent to those skilled in the art having the benefit of the description herein.

DETAILED DESCRIPTION

For simplicity and illustrative purposes, the present disclosure is described by referring mainly to examples thereof. The examples of the present disclosure described herein may be used together in different combinations. In the following description, details are set forth in order to provide an understanding of the present disclosure. It will be readily apparent, however, that the present disclosure may be practiced without limitation to all these details. Also, throughout the present disclosure, the terms "a" and "an" are intended to denote at least one of a particular element. The terms "a" and "an" may also denote more than one of a particular element. As used herein, the term "includes" means includes but not limited to, the term "including" means including but not limited to. The term "based on" means based at least in part on, the term "based upon" means based at least in part upon, and the term "such as" means such as but not limited to. The term "relevant" means closely connected or appropriate to what is being performed or considered.

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications in the illustrated system, and such further applications of the principles of the disclosure as would normally occur to those skilled in the art are to be construed as being within the scope of the present disclosure. It will be understood by those skilled in the art that the foregoing general description and the following detailed description are exemplary and explanatory of the disclosure and are not intended to be restrictive thereof.

In the present document, the word "exemplary" is used herein to mean "serving as an example, instance, or illustration". Any embodiment or implementation of the present subject matter described herein as "exemplary" is not necessarily to be construed as preferred or advantageous over other embodiments. The terms "comprise", "comprising", or any other variations thereof, are intended to cover a non-exclusive inclusion, such that one or more devices or sub-systems or elements or structures or components preceded by "comprises . . . a" does not, without more constraints, preclude the existence of other devices, sub-systems, additional sub-modules. Appearances of the phrase "in an embodiment", "in another embodiment", "in an exemplary embodiment" and similar language throughout this specification may, but not necessarily do, all refer to the same embodiment.

Unless otherwise defined, all technical and scientific terms used herein have the same meaning as commonly understood by those skilled in the art to which this disclosure belongs. The system, methods, and examples provided herein are only illustrative and not intended to be limiting. A computer system (standalone, client, or server, or computer-implemented system) configured by an application may constitute a "module" (or "subsystem") that is configured and operated to perform certain operations. In one embodiment, the "module" or "subsystem" may be implemented mechanically or electronically, so a module includes dedicated circuitry or logic that is permanently configured (within a special-purpose processor) to perform certain operations. In another embodiment, a "module" or a "subsystem" may also comprise programmable logic or circuitry (as encompassed within a general-purpose processor or other programmable processor) that is temporarily configured by software to perform certain operations. Accordingly, the term "module" or "subsystem" should be understood to encompass a tangible entity, be that an entity that is physically constructed permanently configured (hardwired), or temporarily configured (programmed) to operate in a certain manner and/or to perform certain operations described herein.

Embodiments described herein provide a system and method for converting direct analog samples to compressed digitized samples. The system includes a switch capacitor based analog processing unit configured to receive a plurality of input analog samples from an image processing system. The plurality of input analog samples includes a plurality of analog media voltages. Further, the switch capacitor based analog processing unit is configured to compress the received plurality of input analog samples in analog domain to generate compressed analog samples using a plurality of switch capacitor circuitry. The compressed analog samples include a plurality of significant analog samples and a plurality of insignificant analog samples. Further, the system includes an analog-to-digital converter (ADC) electrically connected to the switch capacitor based analog processing unit. The ADC is configured to convert the plurality of significant analog samples to a plurality of digitized significant bits. The ADC is activated for processing the plurality of significant analog samples and power gated for the plurality of insignificant analog samples.

A method for low-energy image processing targeted towards JPEG compression is described, which utilizes switched capacitor-based analog processing scheme for direct analog to JPEG (information) conversion. The end-to-end architecture for JPEG compression incorporates the required Discrete Cosine Transform (DCT) and Q matrices in the ratio of capacitors, majorly using switches and capacitors for performing the mathematical manipulations needed for JPEG compression. Owing to the analog architecture, the present system presents a low power alternative to the traditional digital architecture.

Embodiments of the present disclosure describe a low power direct analog to JPEG compression method, comprising an end-to-end analog processor, wherein the input analog image pixels are converted directly to JPEG encoded image bits. Further, in conjunction with the analog processor, the system employs a mixed-signal processing to enable image compression before digitizing into bits. The mixed signal processing fabric may be realized with switched capacitor networks, voltage/current mode processing using current mirrors and buffers to achieve arithmetic operations including but not limited to multiplication, accumulation, subtraction, division, and the like.

Referring now to the drawings, and more particularly to FIG. 1 through FIG. 9, where similar reference characters denote corresponding features consistently throughout the figures, there are shown preferred embodiments and these embodiments are described in the context of the following exemplary system and/or method.

Figure 1:
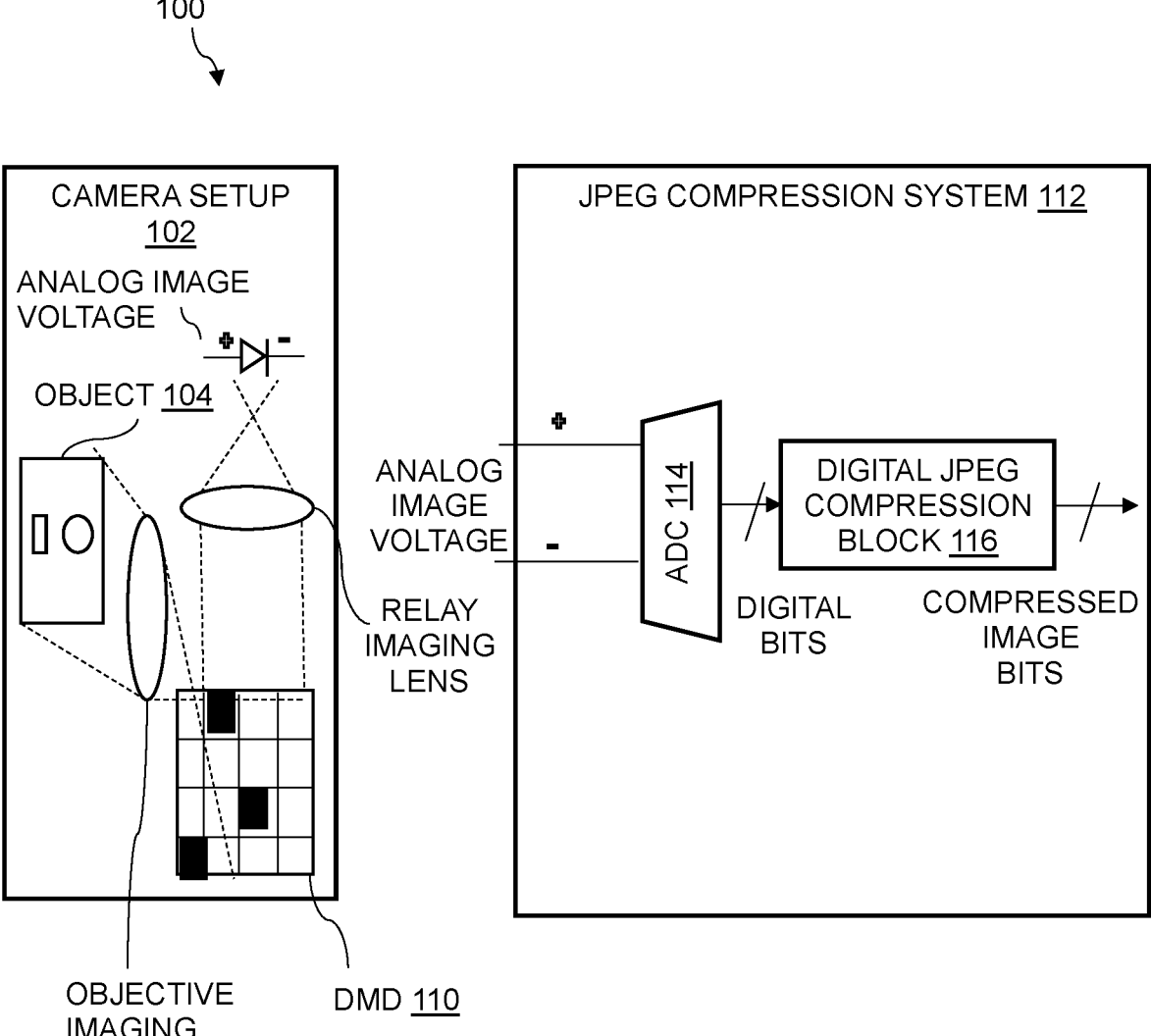
FIG. 1 illustrates an exemplary block diagram representation of a traditional JPEG compression system, according to prior art.
Figure 2A:
FIG. 2A illustrates an exemplary block diagram representation of a network architecture for converting direct analog samples to compressed digitized samples, according to an example embodiment of the present disclosure.
Figure 2A:
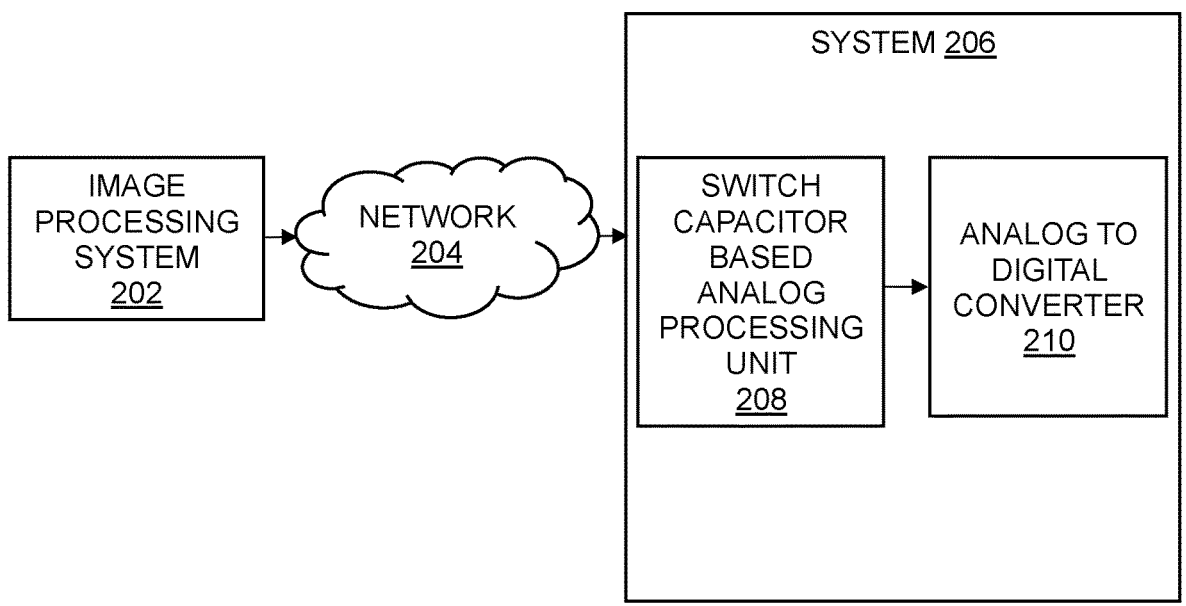

FIG. 2A illustrates an exemplary block diagram representation of a network architecture 200a for converting direct analog samples to compressed digitized samples, according to an example embodiment of the present disclosure. According to FIG. 2A, the network architecture 200a (also referred herein as "the network architecture 200") may include an image processing system 202, and a system 206 communicatively connected to the image processing system 202 via a network 204. The network 204 may be a wireless or a wired network. The system 206 further includes a switch capacitor based analog processing unit 208 and an analog to digital converter 210.

The image processing unit 202 may be configured for capturing a real time image of an object. For example, the real time image may be derived from a video captured by the image processing unit 202 or may be a direct picture captured by the image processing unit 202. The image processing unit 202 may include, such as, but not limited to, a camera. As used in this disclosure, a "camera" may be a device that is configured to sense electromagnetic radiation, such as without limitation visible light, and generate an image representing the electromagnetic radiation. In some cases, a camera may include one or more optics. Exemplary non-limiting optics include spherical lenses, aspherical lenses, reflectors, polarizers, filters, windows, aperture stops, and the like. In some cases, at least a camera may include an image sensor. Exemplary non-limiting image sensors include digital image sensors, such as without limitation charge-coupled device (CCD) sensors and complimentary metal-oxide-semiconductor (CMOS) sensors, chemical image sensors, and analog image sensors, such as without limitation film. In some cases, a camera may be sensitive within a non-visible range of electromagnetic radiation, such as without limitation infrared. In an alternate embodiment, the image processing unit 202 may be, for example, but not limited to, a digital camera, a surveillance camera, a smart phone, a mobile phone, a personal computer, or any other device, which may have an imaging functionality.

The image processing unit 202 may be configured to capture images at real-time and generate a plurality of input analog samples. Each of the plurality of analog samples may include a plurality of analog media voltages. In an example embodiment, an analog media voltage may be an analog JPEG voltage.

Figure 2B:
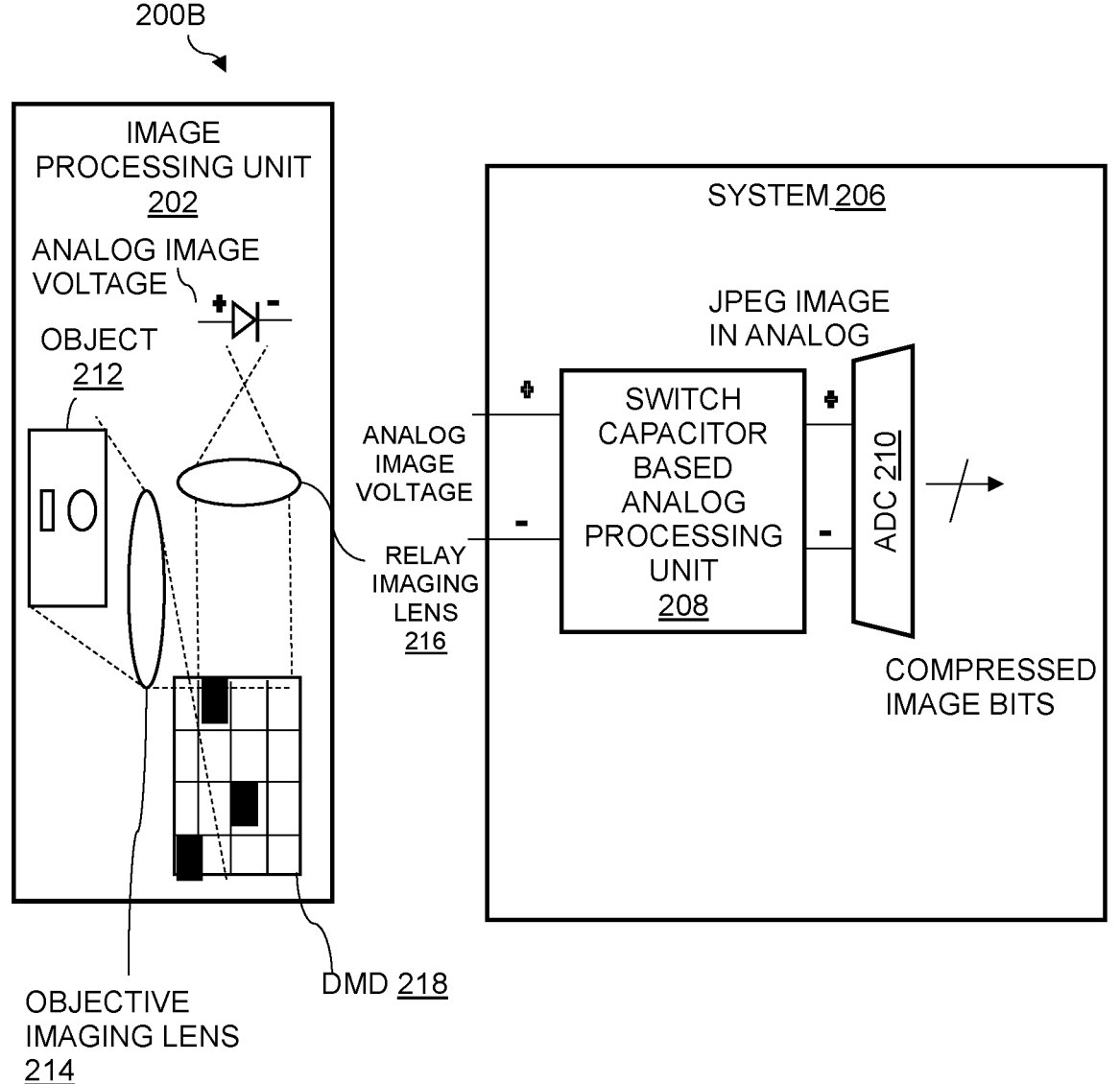
FIG. 2B illustrates an exemplary circuit diagram representation of a network architecture, such as those shown in FIG. 2A, for converting direct analog samples to compressed digitized samples, according to an example embodiment of the present disclosure.

The system 206 may be configured to convert direct analog samples to compressed digitized samples. The system 206 may be connected to the image processing system 202 via the network 204. The system 206 may include a switch capacitor based analog processing unit 208 and an analog to digital (A/D) converter 210. A detailed view of the system 206 is depicted in FIG. 2B. In an exemplary embodiment, the system 206 may be a JPEG compressor, such as, but not limited to, smartphone image processing units integrated into the system-on-chip (SoC) of smartphones, digital camera compression modules, embedded systems for surveillance and the like. In an example embodiment, the term "JPEG compressor" or "the system 206" may refer to both software algorithms and hardware components or accelerators that may assist in compression process.

The switch capacitor based analog processing unit 208 is configured to receive a plurality of input analog samples from an image processing system 202. The plurality of input analog samples comprises a plurality of analog media voltages. The switch capacitor based analog processing unit 208 is further configured to compress the received plurality of input analog samples in analog domain to generate compressed analog samples using a plurality of switch capacitor circuitry. The compressed analog samples may include a plurality of significant analog samples and a plurality of insignificant analog samples.

The analog-to-digital converter (ADC) 210 is electrically connected to the switch capacitor based analog processing unit 208. The ADC 210 is configured to convert the plurality of significant analog samples to a plurality of digitized significant bits. The ADC 210 is activated for processing the plurality of significant analog samples and power gated for the plurality of insignificant analog samples.

Figure 4:
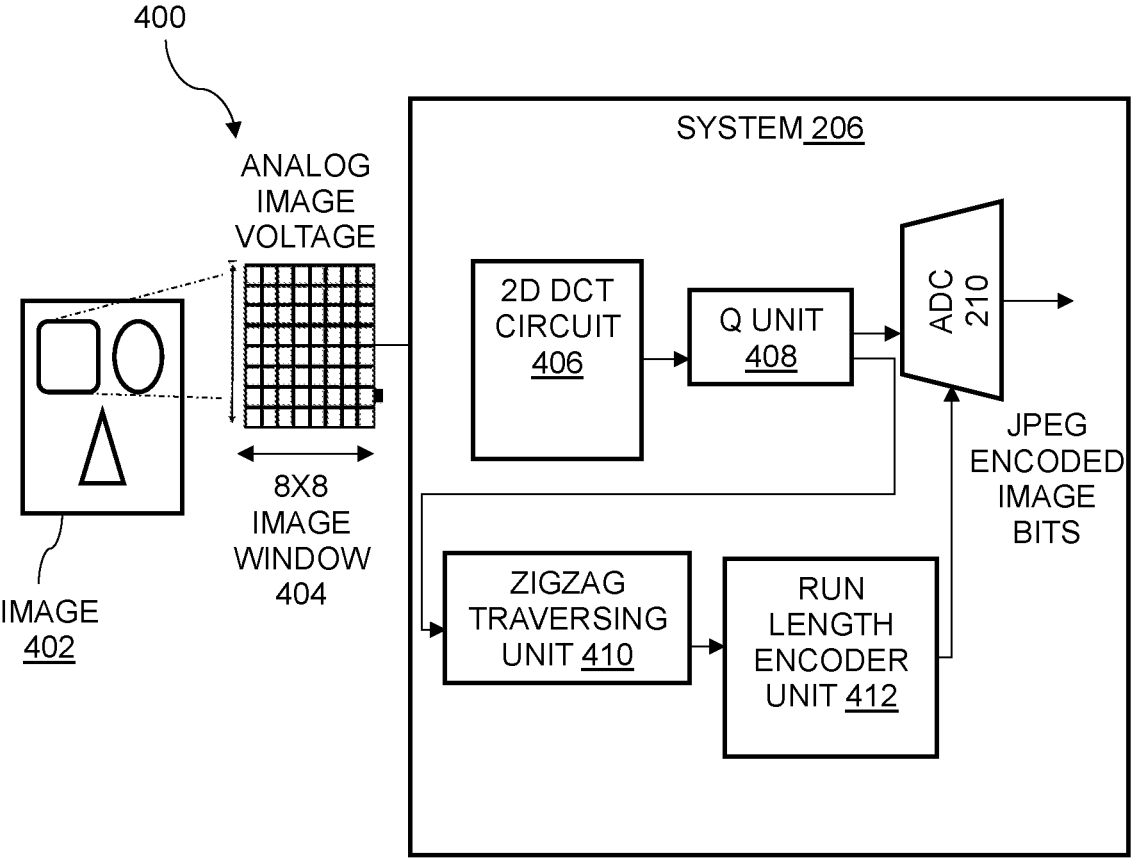
FIG. 4 illustrates an exemplary block diagram representation of the system, such as those shown in FIG. 2A, depicting a complete flow of events for converting direct analog samples to compressed digitized samples, according to an example embodiment of the present disclosure.

In an example embodiment, in compressing the received plurality of input analog samples in the analog domain, the switch capacitor based analog processing unit 208 may include a two-dimensional Discrete Cosine Transform (2D DCT) circuit implemented in a switched capacitor domain. The 2D DCT circuit may include a plurality of switch capacitor circuitry including a plurality of capacitors. The 2D DCT circuit is configured to transform the received plurality of input analog samples into a 2D-DCT samples using a DCT matrix. The received plurality of input analog samples is transformed by performing a plurality of multiply-accumulate (MAC) operations using charge sharing among capacitances of the plurality of capacitors. Further, the switch capacitor based analog processing unit 208 may include a quantization unit configured to perform quantization on the 2D-DCT samples to generate quantized analog samples using a quantization (Q) matrix. The information associated with the DCT matrix, and the quantization (Q) matrix are embedded in a ratio of capacitors. Further, the switch capacitor based analog processing unit 208 may include a zigzag traversing unit configured to serialize the quantized analog samples to generate serialized analog samples comprising the plurality of significant analog samples at the start and a subsequent chain of the plurality of insignificant analog samples. A detailed view of the switch capacitor based analog processing unit 208 is shown in FIG. 4.

In an example embodiment, the system 206 may further include a comparator communicatively coupled to the zigzag traversing unit. The comparator is configured to receive the serialized analog samples from the zigzag traversing unit and classify the serialized analog samples into the plurality of significant analog samples and the plurality of insignificant analog samples based on an external threshold (VThreshold). The output of the comparator acts as an enable signal to the ADC 210 and a run length encoder unit.

In an example embodiment, the switch capacitor circuitry is configured to transfer electric charge to process the received plurality of input analog samples. The capacitor value of each of the plurality of capacitors is stored with one or more elements of the DCT matrix in ratio of the plurality of capacitors and an accumulator capacitor.

Figure 5:
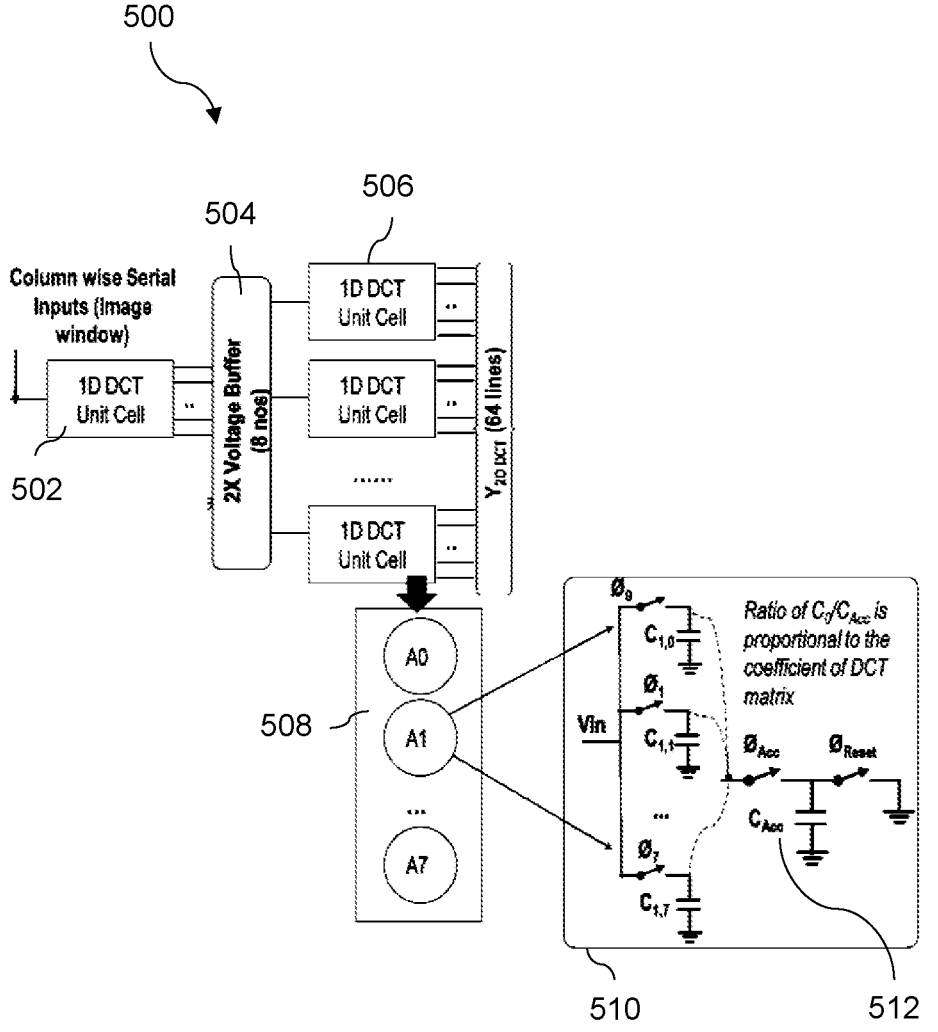
FIG. 5 illustrates an exemplary circuit diagram representation of a switch capacitor based analog processing unit for computing a 2D DCT samples, according to an example embodiment of the present disclosure.

In another example embodiment, in performing the plurality of multiply-accumulate (MAC) operations, the 2D DCT circuit is configured to multiply the received plurality of input analog samples with the DCT matrix, an image window, and a transpose of the DCT matrix. The 2D DCT circuit may include a first stage of n-unit cells configured to perform a 1D DCT for each n cycles. Further, the 2D DCT circuit may include a second stage of parallel n-unit cells configured to generate the 2D DCT samples based on output of the first stage. Each of the n-unit cell may include n accumulators (An), and each accumulator may include n-unit capacitors (Cn) and an accumulator capacitor. Furthermore, the 2D DCT circuit may include a set of voltage buffers for each output of the first stage. The set of voltage buffers are configured to drive input capacitors of the second stage and generate a desired gain value. A detailed view of the 2D DCT circuit is shown in FIG. 5.

In an example embodiment, the switch capacitor based analog processing unit 208 further may include a run length encoder unit configured to perform run-length encoding on the generated serialized analog samples using a counter. The counter may include one of a set mode and a reset mode. The counter is configured to count occurrences of the plurality of insignificant analog samples. Further, the counter is configured to reset a control signal for each occurrence of insignificant analog sample counted. Furthermore, the counter is configured to count occurrences of the plurality of significant analog samples. The counter is further configured to set the control signal for each occurrence of significant analog sample counted. Furthermore, the counter is to generate a final count of the plurality of significant analog samples and the plurality of insignificant analog samples based on the set control signal and the reset control signal. A detailed view of the run length encoder unit is depicted in FIG. 8.

The system 206 may further include a data combiner unit communicatively coupled to the ADC 210 and the run-length encoder unit. The data combiner unit is configured to multiplex the plurality of digitized significant bits of the ADC 210 and output of the run length encoder unit to generate compressed digitized samples.

In an example embodiment, in generating the serialized analog samples, the zigzag traversing unit may include an analog Multiplexer (MUX) and a digital processor configured to serialize the quantized analog samples in order to generate serialized analog samples. Each of the serialized analog samples may include the plurality of significant analog samples at the start and the subsequent chain of the plurality of insignificant analog samples. A detailed view of the zigzag traversing unit is depicted in FIG. 8.

Though few components and subsystems are disclosed in FIG. 2A, there may be additional components and subsystems which is not shown, such as, but not limited to, ports, routers, repeaters, firewall devices, network devices, databases, network attached storage devices, user devices, additional processing systems, servers, assets, machineries, instruments, facility equipment, any other devices, and combination thereof. The person skilled in the art should not be limiting the components/subsystems shown in FIG. 2A. Although FIG. 2A illustrates the system 206, is connected to the image processing unit 202, one skilled in the art may envision that the system 206, may be connected to several image processing unit 202 located at same/different locations.

Those of ordinary skilled in the art will appreciate that the hardware depicted in FIG. 2A may vary for particular implementations. For example, other peripheral devices such as an optical disk drive and the like, local area network (LAN), wide area network (WAN), wireless (e.g., wireless-fidelity (Wi-Fi)) adapter, graphics adapter, disk controller, input/output (I/O) adapter also may be used in addition or place of the hardware depicted. The depicted example is provided for explanation only and is not meant to imply architectural limitations concerning the present disclosure.

Those skilled in the art will recognize that, for simplicity and clarity, the full structure and operation of all data processing systems suitable for use with the present disclosure are not being depicted or described herein. Instead, only so much of the system 206 as is unique to the present disclosure or necessary for an understanding of the present disclosure is depicted and described. The remainder of the construction and operation of the system 206 may conform to any of the various current implementations and practices that were known in the art.

FIG. 2B illustrates an exemplary circuit diagram representation of a network architecture 200, such as those shown in FIG. 2A, for converting direct analog samples to compressed digitized samples, according to an example embodiment of the present disclosure. The network architecture 200 may include the image processing unit 202 and the system 206.

The image processing unit 202 may include a camera setup comprising an object 212, an objective imaging lens 214, a relay imaging lens 216 and a digital micromirror device (DMD) 218. The relay imaging lens 216 is configured to produce an analog image voltage.

The objective imaging lens 214 is positioned to receive light information from the object 212 and focuses it onto a designated image plane. The object may be any scene or an environment or any other setup. The objective imaging lens 214 may utilize advanced optical technologies to ensure precise imaging, producing a detailed representation of the object 212 for subsequent processing.

The relay imaging lens 216 may be configured to enhance analog image voltage generation process. The design of the relay imaging lens 216 may be optimized to transmit the captured image from the objective imaging lens 214 to the digital micromirror device (DMD) 218 in a manner that preserves fidelity of image data. The relay imaging lens 216 achieves this by employing optical principles, minimizing distortions and aberrations during the image transfer process.

The digital micromirror device (DMD) 218 may be configured for converting the digital image data into analog media voltages, such as, for example, analog image voltages. The DMD 218 may utilize an array of micro mirrors to modulate light intensity, creating a corresponding analog voltage that accurately represents the captured image. This transformation from digital to analog is crucial for applications requiring precise voltage representation, such as analog signal processing or interfacing with analog components. The generated analog media voltages are transmitted to the system 206 in the form of a plurality of input analog samples.

The system 206 may further include the switch capacitor based analog processing unit 208 and an analog to digital (A/D) converter 210, as described in FIG. 2A. The switch capacitor based analog processing unit 208 is configured to generate a compressed JPEG image in an analog domain. The analog domain-based processing reduces power consumption while working at a lowered noise margin, i.e., $P_{JPEG} \gg P_{SC}$, where $P_{JPEG}$ corresponds to power consumed in conventional system and $P_{SC}$ corresponds to power consumed in the present system 206. In an exemplary embodiment, the system 206 completes all the processing (arithmetic manipulations) in the analog domain and enables the ADC 210 for significant JPEG image samples, power gating the ADC 210 for insignificant ones. This process saves more than 90% of the ADC's power. Typically, division operation realized through charge sharing between the capacitors requires lower area and power. Consequently, the present system 206 is expected to present a low power alternative to conventional JPEG accelerators.

Figure 3:
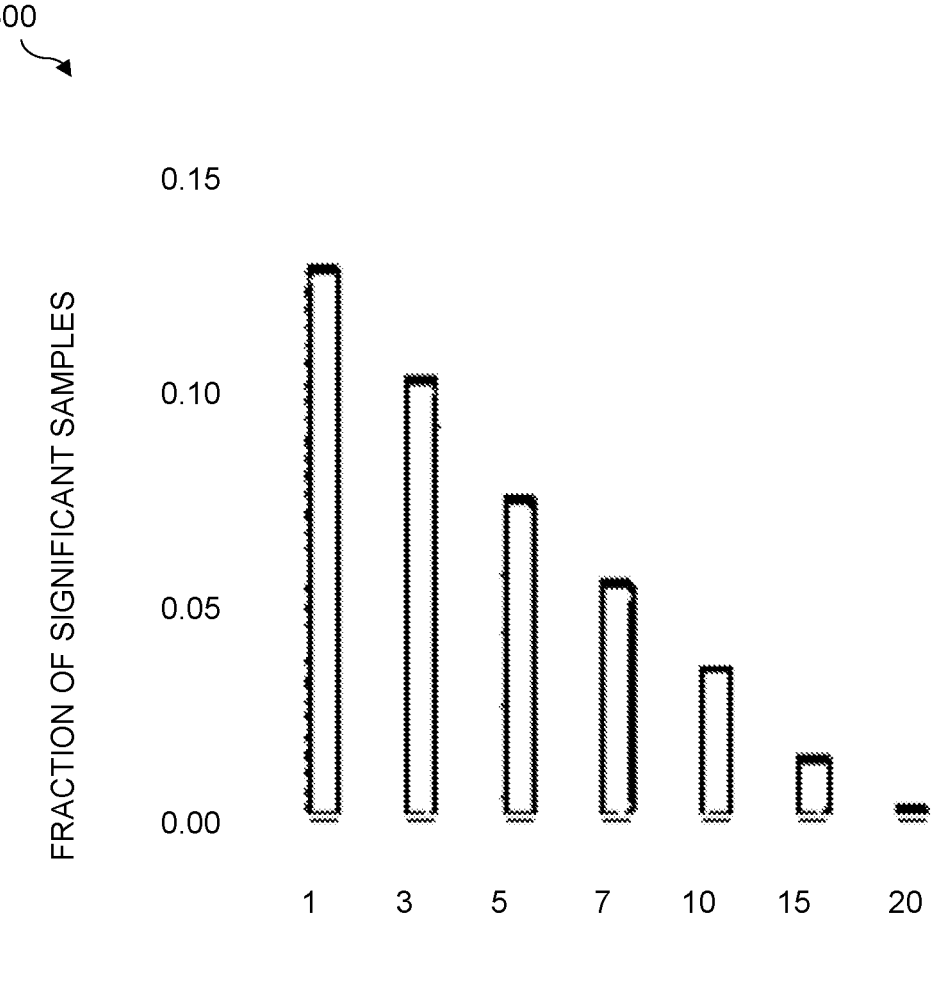
FIG. 3 illustrates a graphical representation of a compression threshold value versus a fraction of significant sample, according to an example embodiment of the present disclosure.

FIG. 3 illustrates a graphical representation of a compression threshold value versus a fraction of significant sample, according to an example embodiment of the present disclosure. In an example embodiment, the compression threshold value may be a specific level or point used in the compression algorithm to determine which data should be compressed and which should be retained in its original form.

FIG. 4 illustrates an exemplary block diagram representation of the system 206, such as those shown in FIG. 2A, depicting a complete flow of events for converting direct analog samples to compressed digitized samples, according to an example embodiment of the present disclosure. In an embodiment, at first, an image 402 is divided into smaller windows 404 of 8×8 pixels for processing. This step is crucial for managing and processing image data in smaller and more manageable chunks. Each 8×8 pixel or image windows are converted into analog image voltages and are fed to a two-dimensional Discrete Cosine Transform (2D DCT) circuit 406 of the system 206. In an exemplary embodiment, the 2D DCT circuit 406 may be implemented in a switched capacitor domain for 2D DCT operations. The 2D DCT circuit 406 utilizes charge sharing among capacitances to perform required Multiply-Accumulate (MAC) operations efficiently. The result is a transformation of the image into a cosine domain, producing a sparse representation. In an example embodiment, the 2D DCT circuit 406 may include the plurality of switch capacitor circuitry comprising a plurality of capacitors. A switch capacitor circuitry is shown in FIG. 7B. The 2D DCT circuit 406 is further configured to transform the received plurality of input analog samples into a 2D-DCT sample using a DCT matrix. The received plurality of input analog samples is transformed by performing a plurality of multiply-accumulate (MAC) operations using charge sharing among capacitances of the plurality of capacitors.

Upon completing the 2D DCT operation, the resulting image is quantized using a Quantization (Q) matrix at a quantization unit 408. The quantization process involves an element-by-element division of the image matrix with the Q matrix. The quantization unit 408 achieves this division operation through charge sharing among capacitors. The quantization unit 408 is configured to perform quantization on the 2D-DCT samples to generate quantized analog samples using the quantization (Q) matrix. The information associated with the DCT matrix, and the quantization (Q) matrix are embedded in a ratio of capacitors. In an embodiment, the quantization unit 408 may include a network of switched capacitors to realize division in mixed-signal domain, using the principle of charge redistribution/sharing. The capacitance values embed the elements of Q matrix in the ratio of capacitors, which acts as the analog memory element. In an exemplary embodiment, the analog memory elements may include, but not limited to, a resistive random-access memory (ReRAM), a phase-change memory (PCM), a floating gate memory, a flash memory, and other non-volatile memories.

The processed image matrix is then serialized in a zigzag fashion by a zigzag traversing unit 410. The zigzag traversing unit 410 is configured to serialize the quantized analog samples to generate serialized analog samples comprising the plurality of significant analog samples at the start and a subsequent chain of the plurality of insignificant analog samples.

Additionally, a run-length encoding technique is applied to reduce the number of bits required to store the JPEG-encoded data using a run length encoder unit 412. This step is crucial for optimizing the storage efficiency of the compressed image. The run length encoder unit 412 is configured to perform run-length encoding on the generated serialized analog samples using a counter.

After generating the serialized analog samples comprising the plurality of significant analog samples at the start and a subsequent chain of the plurality of insignificant analog samples, the ADC 210 is switched on only for significant samples, giving considerable power savings. The ADC 410 is further power gated for the plurality of insignificant analog samples.

The output of the ADC 210 and the run length encoder unit 412 are combined to generate the JPEG encoded image bits.

In an example embodiment, the 2D DCT circuit 406, the quantization unit 408, the zigzag traversing unit 410 and the run length encoder unit 412 may be implemented in mixed-signal domain to perform JPEG compression. mixed-signal circuits to transform the input image samples to Discrete Cosine Transform (DCT) domain. The 2D DCT circuit 406 is implemented with a plurality of switched capacitors for transferring electric charge to process the input data. The capacitor value stores the elements of DCT matrix in their ratios of capacitor with the accumulator capacitor.

FIG. 5 illustrates an exemplary circuit diagram representation of a switch capacitor based analog processing unit 208 for computing a 2D DCT samples, according to an example embodiment of the present disclosure. The 2D DCT circuit 406 corresponds to a serial implementation of the 2D DCT, comprising nine one-dimensional (1D) Discrete Cosine Transform (DCT) unit cells.

In an example embodiment, the 2D DCT circuit 406 may include a first stage of n-unit cells 502 configured to perform a 1D DCT for each n cycles. Further, the 2D DCT circuit 406 may include a second stage of parallel n-unit cells 506 configured to generate the 2D DCT samples based on output of the first stage 502. Each of the n-unit cell 506 may include n accumulators (An) 508. Each accumulator 508 may include n-unit capacitors (Cn) 510 and an accumulator capacitor 512. Further, the 2D DCT circuit 406 may include a set of voltage buffers 504 for each output of the first stage 502. The set of voltage buffers 504 are configured to drive input capacitors of the second stage 506 and generate a desired gain value.

In an exemplary embodiment, a plurality of analog media voltages in the form of plurality of input analog samples are fed to the 2D DCT unit 406. The 2D DCT unit 406 comprises a 1D DCT unit cell 502. A column wise analog pixel samples of the image window are fed to the 1D DCT unit cell 502 as an input. In an example embodiment, a minimum of seventy-two (72) cycles are required to compute a 2D DCT of image window (for example, 8×8). In an example embodiment, the input image needs to be multiplied with DCT matrix, followed by another multiplication with its transpose. The multiply-accumulate (MAC) operation is performed using switched capacitor (SC) circuitry. The contents of the DCT matrix are embedded in the ratio of capacitors that are used in SC. The output of the 1D DCT unit cell 502 is further connected to a voltage buffer 504. The voltage buffer 504 may be comprise, a minimum of, but not limited to, eight 2× voltage buffers. image. The voltage buffers 504 for each output of the first stage drives the input capacitors of the second stage, while providing the required gain. Each of the eight 2× voltage buffers are further connected to each 1D DCT unit cell 506A-8 in serial. Each of the 1D DCT unit cell 506A-8 may include eight outputs, comprising 64 lines. The output of the 1D DCT unit cells 506A-8 corresponds to $Y_{2D\ DCT}$. Each 1D DCT unit cell 502 and 506A-8 are designed to efficiently perform the multiply-accumulate (MAC) operation using switched capacitor circuitry. In an embodiment, the first stage of unit cell 502 performs the 1D DCT for every 9 cycles ($\phi$-$\phi_{Acc}$), which is then sent to the parallel eight-unit cells 506A-8 that finally produce the 2D DCT of the input image.

In an exemplary embodiment, each 1D DCT unit cell 502 and 506A-8 may include, for example, eight accumulators ($A_0$-$A_8$) 508. Eight such accumulators ($A_0$-$A_8$) 508 each realized with different set of unit capacitors ($C_0$-$C_7$) 510 denoting the 64 coefficients of DCT matrix. Specifically, each accumulator 508 may include eight-unit capacitors ($C_0$-$C_7$) 510 and an accumulator capacitor ($C_{Acc}$) 512. The ratio of capacitors determines the value of an element in the DCT matrix. The ratio of capacitors is given by:

$$Ci/\left(\sum Ci + C_{Acc}\right) \qquad \text{equation 1}$$

where Ci refers to capacitance value of one of the capacitors ($C_0$-$C_7$) 510; and
where $C_{Acc}$ refers to capacitance value of the accumulator capacitor 512.

In an exemplary embodiment, the ratio of capacitors is proportional to coefficient of DCT matrix.

Each unit capacitor 510 is sampling the input voltage in one phase ($\phi0$-$\phi7$), while accumulating the sampled analog voltages across accumulator capacitor (CAcc) 512 in phase $\phi_{Acc}$. The accumulators 508 are reset in phase $\phi_{Reset}$.

In an exemplary embodiment, in performing the plurality of multiply-accumulate (MAC) operations, the 2D DCT circuit 406 is configured to multiply the received plurality of input analog samples with the DCT matrix, an image window, and a transpose of the DCT matrix. The 2D DCT ($Y_{2D\ DCT}$) generated at the 1D DCT unit cells 506A-8 is given by:

$$Y_{2DDCT} = A * X_{in} * A^T \qquad \text{equation (2)}$$

In the above equation (2), A refers to DCT matrix;
$A^T$ refers to transpose of the DCT matrix A; and
$X_{in}$ refers to an image window.
Further, the equation below represents:

$$\frac{Ci, j}{Ci, j + C_{Acc}} = \frac{DCTi, j}{\mu} \qquad \text{equation (3)}$$

In the above equation (3), DCT i.j is a DCT value of samples i and j, and μ is intentional attenuation introduced in each DCT unit cell to satisfy equations.

Figure 6:
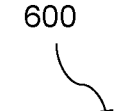
FIG. 6 illustrates an exemplary timing diagram representation of a non-overlapping clock for switch capacitor accumulation, according to an example embodiment of the present disclosure.
Figure 6:
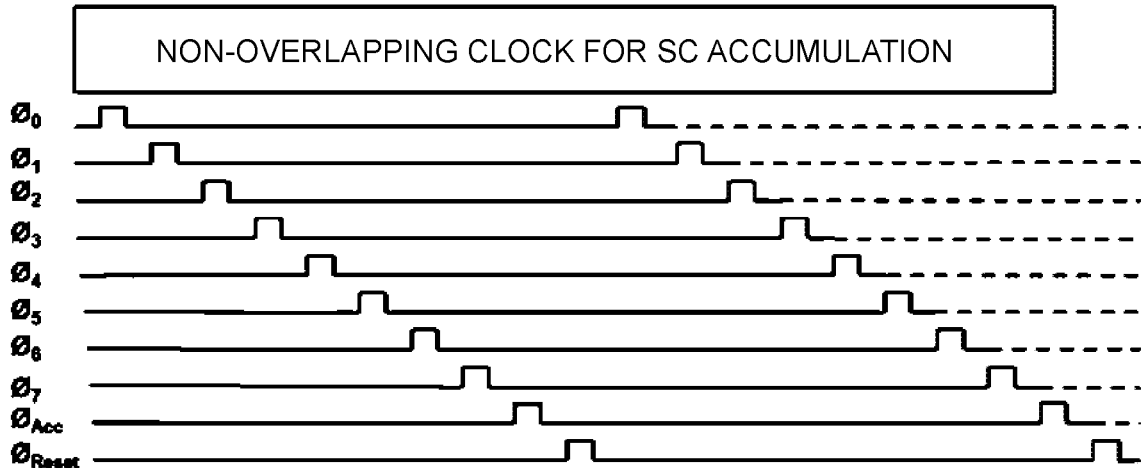
Figure 7A:
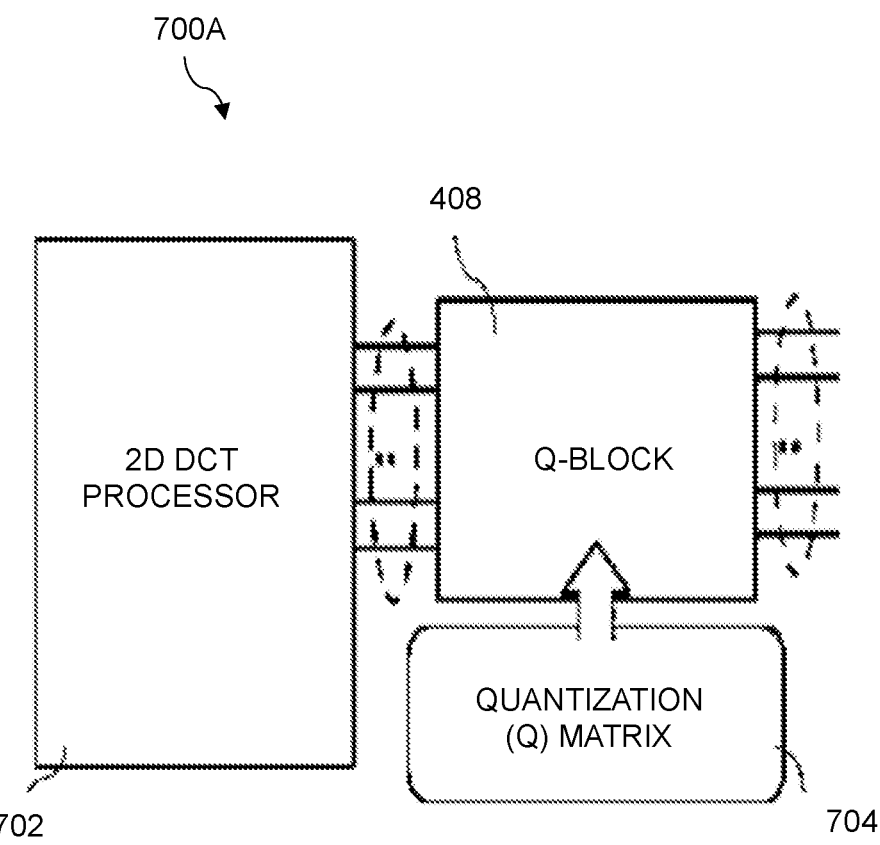
FIG. 7A illustrates an exemplary block diagram representation of an analog implementation of a quantization unit, according to an example embodiment of the present disclosure.
Figure 7B:
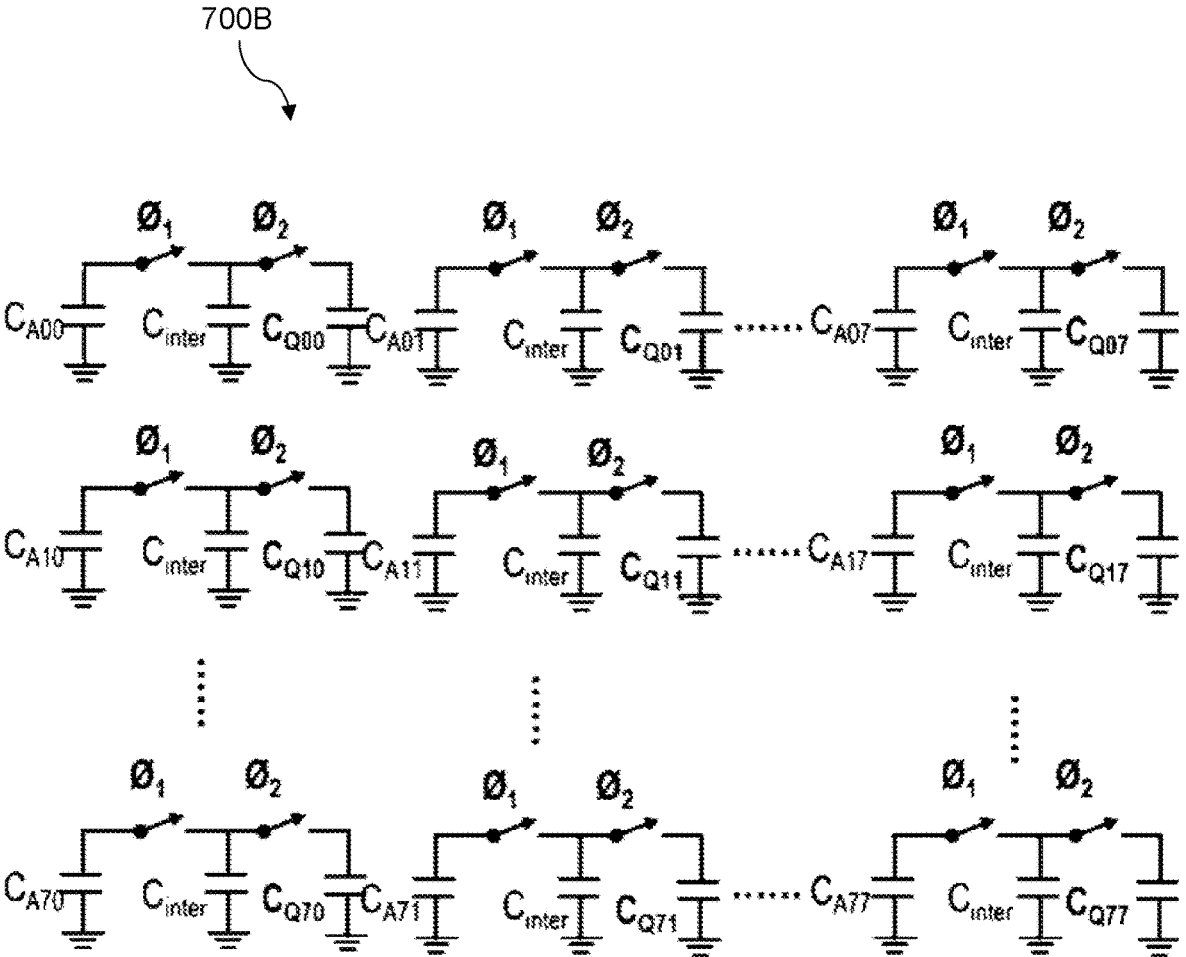
FIG. 7B illustrates an exemplary circuit diagram representation of a switch capacitor circuitry, according to an example embodiment of the present disclosure.

FIG. 6 illustrates an exemplary timing diagram representation of a non-overlapping clock for switch capacitor accumulation, according to an example embodiment of the present disclosure;

FIG. 7A illustrates an exemplary block diagram representation of an analog implementation of a quantization unit 408, according to an example embodiment of the present disclosure. In an example embodiment, the values of the Q matrix are intricately embedded in the ratio of capacitances. The division operation, an integral component of the quantization process, is achieved through charge sharing between capacitances. In addressing challenges associated with the accumulator capacitor's ($C_{Acc}$) size, a novel strategy is introduced. Charge is transferred to a smaller capacitor ($C_{inter}$) before the quantization operation, ensuring practicality in handling the Q caps ($C_{Qij}$). To accurately represent the 64 values of the Q matrix, 64 capacitances ($C_{Qij}$) are strategically chosen to facilitate proper quantization.

Specifically, the Q unit 408 in the 1D DCT unit cell plays a pivotal role in the quantization of the transformed image data. The Q matrix, responsible for the quantization process, necessitates a division operation that is inherently accomplished through charge sharing between capacitances. This method ensures an efficient and accurate quantization process.

One example challenge that arises when using the accumulator capacitor ($C_{Acc}$) 508 in the 1D DCT unit cell is that the $C_{Acc}$ 508 tends to be substantial in size. This poses difficulties in selecting appropriately sized Q capacitors ($C_{Qij}$), potentially leading to impractical and unrealistically large capacitors. To circumvent this challenge, the present system 206 uses a transfer of charge to a smaller capacitor referred to as $C_{inter}$.

The charge transfer to $C_{inter}$ precedes the quantization operation and serves a dual purpose. Firstly, it mitigates the challenges associated with the size of the accumulator capacitor ($C_{Acc}$) 508, ensuring practical handling of Q capacitors. Secondly, it contributes to a more scalable and flexible quantization process, allowing for a wider range of practical capacitor sizes.

In the context of the Q matrix, which comprises 64 values, it is essential to select 64 capacitances ($C_{Qij}$) to accurately represent the quantization levels. This strategic choice ensures that each capacitor corresponds to a specific element in the Q matrix, facilitating a seamless and precise quantization process. The selection of these capacitances is critical to maintaining the fidelity of the quantized image data and optimizing the overall performance of the 1D DCT unit cells 502 and 506.

In an exemplary embodiment, the quantization unit 408 is configured to perform quantization on the 2D-DCT samples to generate quantized analog samples using a quantization (Q) matrix. The information associated with the DCT matrix, and the quantization (Q) matrix are embedded in a ratio of capacitors.

In an exemplary embodiment, the quantized analog samples are given by:

$$Y_{quantized} = \frac{Y_{2DDCT}}{Qmatrix} \qquad \text{equation (4)}$$

where $Y_{2DDCT}$ is output of the 2D DCT circuit 406 and the value $Y_{2DDCT}$ may be <0:63>

$Q_{matrix}$ is a quantization matrix $Y_{quantized}$ may be <0:63>

In an exemplary embodiment, the quantization process may require a 2D DCT processor 702 and the Q unit 408. The quantization matrix 704 is fed as an input to the Q unit 408.

In an exemplary embodiment, the charge sharing among capacitors $C_{Aij}$, $C_{inter}$, and $C_{Qij}$ computes quantization which is basically a division operation. The ratio of capacitors $C_{Aij}$, $C_{inter}$, and $C_{Qij}$ stores the values of the Q matrix 704 operating as a memory where 0<=i<=7, and 0<=j<=7. Further, the phases 1 and @2 performs charge sharing in two phases to transfer the charge to an intermediate lower capacitance $C_{inter}$ to reduce the range of $C_{Qij}$.

FIG. 7B illustrates an exemplary circuit diagram representation of a switch capacitor circuitry 700*b*, according to an example embodiment of the present disclosure.

In an exemplary embodiment, the switch capacitor circuitry 700*b* is configured to transfer electric charge to process the received plurality of input analog samples. The capacitor value of each of the plurality of capacitors 510 is stored with one or more elements of the DCT matrix in ratio of the plurality of capacitors and an accumulator capacitor 512.

For example, $C_{A00}$=500fF, $C_{inter}$=50fF and $Q_{00}$=16/5 (=attenuation factor of 2D DCT)

$$\text{Solve for } C_{Q00}: \quad \frac{1}{Q_{00}} = \frac{C_{A00}}{C_{A00} + C_{Inter}} * \frac{C_{inter}}{C_{inter} + C_{Q00}}$$

where $C_{Q00}$=95fF;

$C_{Aij}$ refers to accumulator capacitance value 508 of the 2D DCT circuit 406;

$C_{inter}$ refers to intermediate lower value capacitance; and $C_{Qij}$ refers to capacitance chosen with respect to Q matrix.

FIG. 8 illustrates an exemplary block diagram representation depicting a process converting direct analog samples to compressed digitized samples, according to an example embodiment of the present disclosure. In an exemplary embodiment, a detailed view of the zigzag traversing unit 410 and the run-length encoder unit 412 is depicted. In an exemplary embodiment, the zigzag traversing unit 410, in generating the serialized analog samples, may include an analog Multiplexer (MUX) 802 and a digital processor 804 configured to: serialize the quantized analog samples to generate serialized analog samples including the plurality of significant analog samples at the start and the subsequent chain of the plurality of insignificant analog samples. In an example embodiment, the zigzag traversing unit 410 may use the analog Multiplexer (MUX) 802 in conjunction with digital processor 804 to serialize the outputs of Q-unit 408 to ensure the most significant samples are present in the beginning, followed by a long chain of insignificant ones (zeros).

In an exemplary embodiment, the system 206 may include a comparator 808 communicatively coupled to the zigzag traversing unit 410. The comparator 808 is configured to receive the serialized analog samples from the zigzag traversing unit 410 and classify the serialized analog samples into the plurality of significant analog samples and the plurality of insignificant analog samples based on an external threshold (VThreshold). The output of the comparator 808 acts as an enable signal to the ADC 210 and the run length encoder unit 412. In an example embodiment, the comparator 808 is used to distinguish the samples for generating the control signal that enables the analog-to-digital converter (ADC) 210 and run length encoder unit 412.

In an exemplary embodiment, the run length encoder unit 412 is configured to perform run-length encoding on the generated serialized analog samples using a counter 806. The counter 806 may include one of a set mode and a reset mode, The counter 806 is configured to count occurrences of the plurality of insignificant analog samples. Further, the counter 806 is configured to reset a control signal for each occurrence of insignificant analog sample counted. Furthermore, the counter 806 is configured to count occurrences of the plurality of significant analog samples. Also, the counter 806 is configured to set the control signal for each occurrence of significant analog sample counted.

Additionally, the counter 806 is configured to generate a final count of the plurality of significant analog samples and the plurality of insignificant analog samples based on the set control signal and the reset control signal. The counter 806 has the set/reset capabilities to count the occurrences of insignificant samples to send out the final count of the samples, instead of each sample itself. This makes sure that the ADC 210 is used only to digitize significant samples, saving energy.

In an embodiment, the 10-bit counter 806 performs:

Counts for EN_B=1; and

Resets for EN_B=0.

In an example embodiment, example 812 of zigzag traversal of JPEG encoded image is shown.

In an exemplary embodiment, the system 206 may further include a data combiner unit 810 communicatively coupled to the ADC and the run-length encoder unit 412. The data combiner unit 810 is configured to multiplex the plurality of digitized significant bits of the ADC 210 and output of the run length encoder unit 412 to generate compressed digitized samples.

In operation, the outputs of the Q unit 408 are serialized in a zigzag fashion to ensure that all significant samples occur in the beginning, followed by a long chain of insignificant samples. A digital processor 804 is synthesized to generate the select bits, corresponding to zigzag traversing, of the 64:1 analog MUX 802, which eventually provides the serialized analog samples. These samples are fed to the comparator 808, which segregates the significant samples based on the external threshold (VThreshold). The output of the comparator 808 serves as an enable signal (EN) to the ADC 210 and the run-length encoder unit 412. The 10-bit Successive Approximation Register (SAR) ADC 210 is active only for significant analog samples that generate the digital counterparts of the input analog values.

The run-length encoder unit 412 may be a 10-bit counter that has a control signal which counts the number of occurrences of insignificant samples, before resetting the same with the occurrence of a significant sample. The data combiner unit 810 may combine the outputs of the ADC 210 and the run-length encoder unit 412 to produce the JPEG encoded digital bits.

FIG. 9 illustrates an exemplary flow chart representation of a method 900 for converting direct analog samples to compressed digitized samples, according to an example embodiment of the present disclosure. At step 902, the method 900 includes receiving a plurality of input analog samples from an image processing system 202. The plurality of input analog samples comprises a plurality of analog media voltages. At step 904, the method 900 includes compressing the received plurality of input analog samples in an analog domain to generate compressed analog samples using a plurality of switch capacitor circuitry 700*b*.

The compressed analog samples may include a plurality of significant analog samples and a plurality of insignificant analog samples. At step 906, the method 900 includes converting the plurality of significant analog samples to a plurality of digitized significant bits. The converting the plurality of significant analog samples may include activating an analog to digital converter 210 for processing the plurality of significant analog samples and power gating the ADC 210 for the plurality of insignificant analog samples.

In compressing the received plurality of input analog samples in analog domain to generate compressed analog samples using a plurality of switch capacitor circuitry 700*b*, the method 900 may include transforming the received plurality of input analog samples into a 2D-DCT samples using a DCT matrix. The received plurality of input analog samples is transformed by performing a plurality of multiply-accumulate (MAC) operations using charge sharing among capacitances of plurality of capacitors 510. Further, the method 900 may include performing quantization on the 2D-DCT samples to generate quantized analog samples using a quantization (Q) matrix. The information associated with the DCT matrix, and the quantization (Q) matrix are embedded in a ratio of capacitors. The method 900 includes serializing the quantized analog samples to generate serialized analog samples comprising the plurality of significant analog samples at the start and a subsequent chain of the plurality of insignificant analog samples.

In an example embodiment, the method 900 may include receiving the serialized analog samples from zigzag traversing unit 410. Further, the method 900 may include classifying the serialized analog samples into the plurality of significant analog samples and the plurality of insignificant analog samples based on an external threshold (VThreshold).

In an example embodiment, in performing a plurality of multiply-accumulate (MAC) operations using charge sharing among capacitances of plurality of capacitors 510, the method 900 includes transferring electric charge to process the received plurality of input analog samples. The capacitor value of each of the plurality of capacitors is stored with one or more elements of the DCT matrix in ratio of the plurality of capacitors 510 and an accumulator capacitor 512.

In performing the plurality of multiply-accumulate (MAC) operations, the method 900 may include multiplying the received plurality of input analog samples with a DCT matrix, image window and a transpose of the DCT matrix. Further, the method 900 may include performing a 1D DCT for each n cycles in a first stage of n-unit cells. Furthermore, the method 900 may include generating the 2D DCT samples in a second stage of parallel n-unit cells based on output of the first stage. Each of the n-unit cell may include n accumulators (An) 508, and each accumulator comprises n-unit capacitors (Cn) 510 and an accumulator capacitor 512. The method 900 may include generating a desired gain value by using the n-unit capacitors in the second stage.

In an example embodiment, the method 900 may include performing run-length encoding on the generated serialized analog samples using a counter 806. The counter 806 may include one of a set mode and a reset mode.

In performing run-length encoding on the generated serialized analog samples using a counter 806, the method 900 may include counting occurrences of the plurality of insignificant analog samples. The method 900 may include resetting a control signal for each occurrence of insignificant analog sample counted. The method 900 further includes counting occurrences of the plurality of significant analog samples. Further, the method 900 may include setting the control signal for each occurrence of significant analog sample counted. Additionally, the method 900 may include generating a final count of the plurality of significant analog samples and the plurality of insignificant analog samples based on the set control signal and the reset control signal.

In an example embodiment, the method 900 may include multiplexing the plurality of digitized significant bits of the ADC 210 and output of the run length encoder unit 412 to generate compressed digitized samples.

In generating the serialized analog samples, the method 900 may include serializing the quantized analog samples to generate serialized analog samples comprising the plurality of significant analog samples at the start and a subsequent chain of the plurality of insignificant analog samples.

In an exemplary embodiment, the method 900 of low-power direct analog to information conversion may be extended to other algorithms/applications to benefit from low-power compute of mixed-signal processing and ADC energy savings. For example, the direct analog to information converter processes the sensed/acquisitioned analog samples directly to information in mixed signal domain before digitization. The direct analog to information converter employs a plurality of switched capacitors or the like to perform the underlying Multiply-Accumulate (MAC) and division operations in mixed-signal domain for any given algorithm. The switched capacitor-based mixed-signal computation technique may use the principle of charge sharing/redistribution to perform arithmetical manipulations (such as, for example, multiplication, accumulation, and division). In an example embodiment, the algorithms/applications may include, for example, but not limited tom an image, a video, or computer vision applications, such as PNG, MJPEG, H.264, convolution filters, object avoidance or recognition, and the like. These techniques are used to directly process the analog samples acquired/sensed from sensor nodes, such as biosensors, augmented reality (AR) or virtual reality (VR) nodes, and the like and produce processed digital output. Such processing may be intended for compression, information generation or inference or the like.

The method 900 may be implemented in any suitable hardware, software, firmware, or combination thereof. The order in which the method 900 is described is not intended to be construed as a limitation, and any number of the described method blocks may be combined or otherwise performed in any order to implement the method 900 or an alternate method. Additionally, individual blocks may be deleted from the method 900 without departing from the spirit and scope of the present disclosure described herein. Furthermore, the method 900 may be implemented in any suitable hardware, software, firmware, or a combination thereof, that exists in the related art or that is later developed.

The method 900 describes, without limitation, the implementation of the system 206. A person of skill in the art will understand that method 900 may be modified appropriately for implementation in various manners without departing from the scope and spirit of the disclosure.

The present system 206 provides a low-power direct analog to JPEG image compression, in order to meet the requirements of the power constraints in, for example, imaging sensor nodes. The present system 206 performs the entire process of converting raw analog pixel data into efficiently encoded JPEG information bits. In contrast to conventional digital processing, the present system 206 operates with reduced noise margins, delivering comparable functionality at significantly lower power costs.

The key element of the introduced analog compression technique involves the utilization of switched capacitor circuits for arithmetic operations in the mixed-signal domain. Additionally, capacitors are employed to store data in the form of accumulated charge, embedding information related to Discrete Cosine Transform (DCT) and Quantization (Q) matrices in the capacitor ratio. This integration of switched capacitor circuits and analog storage facilitates a substantial reduction in power consumption compared to existing state-of-the-art JPEG digital accelerators. Moreover, the present method 900 has the potential for extension to various algorithms, applications, and sensor nodes, including video processing and biosensor nodes that currently rely on digital processing.

Further, the present direct analog to JPEG compression technique conducts all processing, including arithmetic manipulations, in the analog domain. The ADC 210 is selectively activated only for significant JPEG image samples, employing power gating for insignificant ones. This strategic approach results in a remarkable power saving of over 90% in the ADC 210, further enhancing the energy efficiency of the overall image compression process. Furthermore, the use of the method to power the ADC 210 for significant information samples eliminates the need to convert all the raw sensed analog samples to digital bits for processing.

The present system 206 utilizes the ADC 210 for significant JPEG image samples. For insignificant samples, power gating is employed to deactivate the ADC 210, resulting in a reduction of more than 90% in ADC power consumption. The savings in power achieved through this method make it particularly suitable for imaging sensor nodes with restrained power budgets.

In an embodiment, the system 206 may be connected to any external systems (not shown) for further processing of the JPEG digitized bits. In one example embodiment, the system 206 may also include a hardware processor(s) (not shown) which may be coupled to a memory (not shown in FIGs.). The memory may include a plurality of modules/subsystems. The system 206 may be a hardware device including the hardware processor executing machine-readable program instructions for converting the direct analog samples to compressed digitized samples. Execution of the machine-readable program instructions by the hardware processor may enable the system 206 to convert the direct analog samples to compressed digitized samples. The "hardware" may comprise a combination of discrete components, an integrated circuit, an application-specific integrated circuit, a field-programmable gate array, a digital signal processor, or other suitable hardware. The "software" may comprise one or more objects, agents, threads, lines of code, subroutines, separate software applications, two or more lines of code, or other suitable software structures operating in one or more software applications or on one or more processors.

The hardware processor(s) may include, but are not limited to, microprocessors, microcomputers, microcontrollers, digital signal processors, central processing units, state machines, logic circuits, and/or any devices that manipulate data or signals based on operational instructions, and the like. Among other capabilities, hardware processor may fetch and execute computer-readable instructions in the memory operationally coupled with the system 206 for performing tasks such as data processing, input/output processing, and/or any other functions. Any reference to a task in the present disclosure may refer to an operation being or that may be performed on data.

One of the ordinary skill in the art will appreciate that techniques consistent with the present disclosure are applicable in other contexts as well without departing from the scope of the disclosure.

What has been described and illustrated herein are examples of the present disclosure. The terms, descriptions, and figures used herein are set forth by way of illustration only and are not meant as limitations. Many variations are possible within the spirit and scope of the subject matter, which is intended to be defined by the following claims and their equivalents in which all terms are meant in their broadest reasonable sense unless otherwise indicated.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

The embodiments herein can comprise hardware and software elements. The embodiments that are implemented in software include but are not limited to, firmware, resident software, microcode, a. The functions performed by various modules described herein may be implemented in other modules or combinations of other modules. For the purposes of this description, a computer-usable or computer-readable medium can be any apparatus that can comprise, store, communicate, propagate, or transport the program for use by or in connection with the instruction execution system, apparatus, or device.

A description of an embodiment with several components in communication with each other does not imply that all such components are required. On the contrary, a variety of optional components are described to illustrate the wide variety of possible embodiments of the invention. When a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article, or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, and the like, of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open-ended in that an item or items following any one of these words is not meant to be an exhaustive listing of such item or items or meant to be limited to only the listed item or items. It must also be noted that as used herein and in the appended claims, the singular forms "a", "an", and "the" include plural references unless the context clearly dictates otherwise.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the embodiments of the present invention are intended to be illustrative, but not limited, of the scope of the invention, which is outlined in the following claims.

What is claimed is:

1. A system for converting direct analog samples to compressed digitized samples, the system comprising:
  a switch capacitor based analog processing unit configured to:
    receive a plurality of input analog samples from an image processing system, wherein the plurality of input analog samples comprises a plurality of analog media voltages; and
    compress the received plurality of input analog samples in analog domain to generate compressed analog samples using a plurality of switch capacitor circuitry, wherein the compressed analog samples comprise a plurality of significant analog samples and a plurality of insignificant analog samples; and
  an analog-to-digital converter (ADC) electrically connected to the switch capacitor based analog processing unit, wherein the ADC is configured to convert the plurality of significant analog samples to a plurality of digitized significant bits, and wherein the ADC is activated for processing the plurality of significant analog samples and power gated for the plurality of insignificant analog samples; and
  the switch capacitor based analog processing unit further comprises a run length encoder unit configured to perform run-length encoding on serialized analog samples using a counter.

2. The system of claim 1, wherein in compressing the received plurality of input analog samples in the analog domain to generate the compressed analog samples using the plurality of switch capacitor circuitry, the switch capacitor based analog processing unit comprises:
  a two-dimensional Discrete Cosine Transform (2D DCT) circuit implemented in a switched capacitor domain, wherein the 2D DCT circuit comprises the plurality of switch capacitor circuitry comprising a plurality of capacitors, wherein the 2D DCT circuit is configured to transform the received plurality of input analog samples into a 2D-DCT samples using a DCT matrix, wherein the received plurality of input analog samples are transformed by performing a plurality of multiply-accumulate (MAC) operations using charge sharing among capacitances of the plurality of capacitors;
  a quantization unit configured to perform quantization on the 2D-DCT samples to generate quantized analog samples using a quantization (Q) matrix, wherein information associated with the DCT matrix, and the quantization (Q) matrix are embedded in a ratio of capacitors; and
  a zigzag traversing unit configured to serialize the quantized analog samples to generate the serialized analog samples comprising the plurality of significant analog samples at the start and a subsequent chain of the plurality of insignificant analog samples.

3. The system of claim 2, further comprising:
  a comparator communicatively coupled to the zigzag traversing unit, wherein the comparator is configured to receive the serialized analog samples from the zigzag traversing unit and classify the serialized analog samples into the plurality of significant analog samples and the plurality of insignificant analog samples based on an external threshold (VThreshold), wherein output of the comparator acts as an enable signal to the ADC and a run length encoder unit.

4. The system of claim 2, wherein the switch capacitor circuitry is configured to transfer electric charge to process the received plurality of input analog samples and wherein capacitor value of each of the plurality of capacitors is stored with one or more elements of the DCT matrix in ratio of the plurality of capacitors and an accumulator capacitor.

5. The system of claim 2, wherein in performing the plurality of multiply-accumulate (MAC) operations, the 2D DCT circuit is configured to multiply the received plurality of input analog samples with the DCT matrix, an image window, and a transpose of the DCT matrix.

6. The system of claim 5, wherein the 2D DCT circuit comprises:

a first stage of n-unit cells configured to perform a 1D DCT for each n cycles; and a second stage of parallel n-unit cells configured to generate the 2D DCT samples based on output of the first stage, wherein each of the n-unit cell comprises n accumulators (An), and wherein each accumulator comprises n-unit capacitors (Cn) and an accumulator capacitor; and a set of voltage buffers for each output of the first stage, wherein the set of voltage buffers are configured to drive input capacitors of the second stage.

7. The system of claim 2, wherein in generating the serialized analog samples, the zigzag traversing unit comprises an analog Multiplexer (MUX) and a digital processor, wherein the zigzag traversing unit is configured to: serialize the quantized analog samples to generate serialized analog samples comprising the plurality of significant analog samples at the start and the subsequent chain of the plurality of insignificant analog samples.

8. The system of claim 1, wherein the counter comprises one of a set mode and a reset mode, wherein the counter is configured to:

count occurrences of the plurality of insignificant analog samples;

resetting a control signal for each occurrence of insignificant analog sample counted;

counting occurrences of the plurality of significant analog samples;

setting the control signal for each occurrence of significant analog sample counted; and generating a final count of the plurality of significant analog samples and the plurality of insignificant analog samples based on the set control signal and the reset control signal.

9. The system of claim 1, further comprising:

a data combiner unit communicatively coupled to the ADC and the run-length encoder unit, wherein the data combiner unit is configured to multiplex the plurality of digitized significant bits of the ADC and output of the run length encoder unit to generate compressed digitized samples.

10. A method for converting direct analog samples to compressed digitized samples, the method comprising:

receiving a plurality of input analog samples from an image processing system, wherein the plurality of input analog samples comprises a plurality of analog media voltages;

compressing the received plurality of input analog samples in an analog domain to generate compressed analog samples using a plurality of switch capacitor circuitry, wherein the compressed analog samples comprise a plurality of significant analog samples and a plurality of insignificant analog samples;

converting the plurality of significant analog samples to a plurality of digitized significant bits, and wherein converting the plurality of significant analog samples comprises activating an analog to digital converter for processing the plurality of significant analog samples and power gating the ADC for the plurality of insignificant analog samples; and multiplexing the plurality of digitized significant bits of the ADC and output of a run length encoder unit to generate compressed digitized samples.

11. The method of claim 10, wherein compressing the received plurality of input analog samples in analog domain to generate compressed analog samples using a plurality of switch capacitor circuitry comprises:

transforming the received plurality of input analog samples into a 2D-DCT samples using a DCT matrix, wherein the received plurality of input analog samples is transformed by performing a plurality of multiply-accumulate (MAC) operations using charge sharing among capacitances of plurality of capacitors;

performing quantization on the 2D-DCT samples to generate quantized analog samples using a quantization (Q) matrix, wherein information associated with the DCT matrix, and the quantization (Q) matrix are embedded in a ratio of capacitors; and serializing the quantized analog samples to generate serialized analog samples comprising the plurality of significant analog samples at the start and a subsequent chain of the plurality of insignificant analog samples.

12. The method of claim 11, further comprising:

receiving the serialized analog samples from zigzag traversing unit; and classifying the serialized analog samples into the plurality of significant analog samples and the plurality of insignificant analog samples based on an external threshold (VThreshold).

13. The method of claim 11, wherein performing a plurality of multiply-accumulate (MAC) operations using charge sharing among capacitances of plurality of capacitors comprises:

transferring electric charge to process the received plurality of input analog samples, wherein capacitor value of each of the plurality of capacitors is stored with one or more elements of the DCT matrix in ratio of the plurality of capacitors and an accumulator capacitor.

14. The method of claim 11, wherein performing the plurality of multiply-accumulate (MAC) operations comprises:

multiplying the received plurality of input analog samples with a DCT matrix, image window and a transpose of the DCT matrix;

performing a 1D DCT for each n cycles in a first stage of n-unit cells; and generating the 2D DCT samples in a second stage of parallel n-unit cells based on output of the first stage, wherein each of the n-unit cell comprises n accumulators (An), and wherein each accumulator comprises n-unit capacitors (Cn) and an accumulator capacitor.

15. The method of claim 11, further comprising:

performing run-length encoding on the generated serialized analog samples using a counter, wherein the counter comprises one of a set mode and a reset mode.

16. The method of claim 15, wherein performing run-length encoding on the generated serialized analog samples using the counter comprises:

counting occurrences of the plurality of insignificant analog samples;

resetting a control signal for each occurrence of insignificant analog sample counted;

counting occurrences of the plurality of significant analog samples;

setting the control signal for each occurrence of significant analog sample counted; and generating a final count of the plurality of significant analog samples and the plurality of insignificant analog samples based on the set control signal and the reset control signal.

17. The method of claim 11, wherein generating the serialized analog samples comprises:

serializing the quantized analog samples to generate serialized analog samples comprising the plurality of significant analog samples at the start and a subsequent chain of the plurality of insignificant analog samples.

18. A non-transitory computer-readable medium comprising machine-readable instructions that are executable by a processor to:

receive a plurality of input analog samples from an image processing system, wherein the plurality of input analog samples comprises a plurality of analog media voltages, wherein the plurality of input analog samples are compressed in analog domain to generate compressed analog samples using a plurality of switch capacitor circuitry, and wherein the compressed analog samples comprise a plurality of significant analog samples and a plurality of insignificant analog samples;

convert the plurality of significant analog samples to a plurality of digitized significant bits, and wherein converting the plurality of significant analog samples comprises activating an analog to digital converter for processing the plurality of significant analog samples and power gating the ADC for the plurality of insignificant analog samples; and multiplex the plurality of digitized significant bits of the ADC and output of a run length encoder unit to generate compressed digitized samples.

*    *    *    *    *